United States Patent
Lee et al.

(10) Patent No.: US 8,816,294 B2
(45) Date of Patent: Aug. 26, 2014

(54) PHOTO DIODE FOR DETECTING X-RAY AND MANUFACTURING METHOD THEREOF

(75) Inventors: Jong Moon Lee, Incheon (KR); Young Sik Kim, Gyeongbuk (KR); Ju Han Kim, Daegu (KR); Jae Hyung Jo, Busan (KR)

(73) Assignee: LG Display Co., Ltd., Seoul (KR)

( * ) Notice: Subject to any disclaimer, the term of this patent is extended or adjusted under 35 U.S.C. 154(b) by 235 days.

(21) Appl. No.: 12/845,226

(22) Filed: Jul. 28, 2010

(65) Prior Publication Data

US 2011/0139994 A1    Jun. 16, 2011

(30) Foreign Application Priority Data

Dec. 10, 2009 (KR) .......................... 10-2009-0122766

(51) Int. Cl.
*H01L 27/146* (2006.01)

(52) U.S. Cl.
USPC ............. 250/370.14; 250/370.09; 250/370.08

(58) Field of Classification Search
USPC ............................ 250/370.08, 370.09, 370.14
See application file for complete search history.

(56) References Cited

U.S. PATENT DOCUMENTS

| | | | | |
|---|---|---|---|---|
| 8,022,449 | B2 * | 9/2011 | Nagai | 257/290 |
| 2009/0267121 | A1 | 10/2009 | Ishida et al. | |
| 2011/0156996 | A1 * | 6/2011 | Izumi | 345/92 |
| 2011/0266599 | A1 * | 11/2011 | Ishida et al. | 257/292 |

FOREIGN PATENT DOCUMENTS

| | | |
|---|---|---|
| CN | 100495743 C | 6/2009 |
| CN | 101567378 A | 10/2009 |
| WO | 2004054005 A1 | 6/2004 |

OTHER PUBLICATIONS

The First Office Action dated Aug. 31, 2012 from The State Intellectual Property Office of the People's Republic of China in a counterpart Chinese application.

* cited by examiner

*Primary Examiner* — Christine Sung
(74) *Attorney, Agent, or Firm* — Morgan, Lewis & Bockius LLP

(57) ABSTRACT

An x-ray detection photo diode is disclosed. The disclosed x-ray detection photo diode includes: a substrate; a first electrode formed on the substrate; a photoconductor layer formed on the first electrode in a narrower area than that of the first electrode; and a second electrode formed on the photoconductor layer. In this manner, the x-ray detection photo diode enables the electrode structure to be changed. As such, a leakage current generated in edges of the x-ray detection photo diode can be minimized.

12 Claims, 5 Drawing Sheets

PHOTO DIODE FOR DETECTING X-RAY AND MANUFACTURING METHOD THEREOF

CROSS-REFERENCE TO RELATED APPLICATION

This application claims priority under 35 U.S.C. 119 to Korean Patent Application No. 10-2009-0122766, filed on Dec. 10, 2009, which is hereby incorporated by reference in its entirety.

BACKGROUND

1. Field of the Disclosure

This disclosure relates to a photo diode for detecting x-rays.

2. Description of the Related Art

The diagnostic x-ray cameras being currently used in a medical field take a photograph using a screen film. The x-ray photograph screen film must be developed in order to display an x-ray photograph image. Recently, digital x-ray detectors have been developed and researched which are configured to use thin film transistors based on semiconductor technologies.

Also, radioactive ray detectors are ordinarily configured to detect radioactive rays penetrating through the human body, so as to obtain image information. To this end, the x-ray detector includes an x-ray detection flat-substrate corresponding to a detection panel which converts radioactive rays with the image information into electrical signals. Similarly, x-ray image apparatuses must include a detection element configured to detect x-rays passing through an object and convert the detected x-rays into electrical signals.

The detection element is formed in a flat panel on which a plurality of unit cells each having a thin film transistor are used as a detection pixel and arranged. As such, the detection apparatus using the TFT substrate sequentially selects gate electrodes of the thin film transistors in one column and reads electrical signals detected by the arranged pixels in one column, in order to obtain an image data including the electrical signals for the pixels. Also, the detection apparatus applies the electric pixel signals included in the image data to a display device such as a monitor or others, thereby providing a digital image.

More specifically, each of the detection pixels arranged on the x-ray detection panel include a photoconductor configured to generate electric charges in proportion to the amount of irradiated x-rays, and a collection electrode configured to collect the electric charges generated in the photoconductor. The detection pixel further includes a capacitor configured to charge the collected electric charges collected by the collection electrode, and a switching element configured to selectively transfer the electric charges charged into the capacitor to a read-out line. The photoconductor is used to convert the x-ray into an electric signal. In detail, the photoconductor generates pairs of electrons and holes corresponding to the x-rays. Such a photoconductor is formed from selenium with a light-to-electric converting property.

The switching element is implemented to include a thin film transistor. The thin film transistor includes a gate electrode connected to a gate line and a source electrode connected to a read-out line. When the electric charges generated by incident x-rays are charged into the capacitor, the thin film transistor outputs a voltage signal charged into the capacitor to the read-out line, so that a photographed image can be reproduced.

FIG. 1 is a cross-sectional view showing the structure of a pixel on an x-ray detection panel of the related art. Referring to FIG. 1, the pixel includes an insulation layer 12 formed on a substrate 10, and a drain electrode 13 of a thin film transistor disposed on the insulation layer 12. The pixel further includes a cathode electrode 20 disposed opposite the drain electrode 13 in the center of a first protective layer 15, a photoconductor layer 25 formed on the cathode electrode 20, and an anode electrode 30 disposed on the photoconductor layer 25 opposite to the cathode electrode 20. The pixel still further includes a second protective layer 32 formed to cover the anode electrode 30, and a power line 40 disposed on the second protective layer 40 and connected to the anode electrode 30.

The cathode electrode 20, photoconductor layer 25, and anode electrode 30 form a photo diode which converts x-rays or natural light irradiated from the external into an electric signal and charges the converted electric signal. The charged electric signal is output to a read-out line (not shown) when a driving signal is applied to the gate electrode of the thin film transistor disposed in a pixel region. Therefore, the charged electric signal can be used to display an image.

Such a photo diode is largely subjected to a leakage current in its electrical performance. This results from the fact that the power line 40 is used to bias the photo diode. If the leakage current greatly increases, the electrical performance of the photo diode seriously deteriorates. Particularly, it is issued a leakage current generated along the edge of the photo diode entirely occupying the pixel region.

BRIEF SUMMARY

Accordingly, the present embodiments are directed to an x-ray detection photo diode that substantially obviates one or more of problems due to the limitations and disadvantages of the related art, and an x-ray detection panel with the same.

An object of the present disclosure is to provide an x-ray detection photo diode that is adapted to minimize a leakage current generated in its edges by changing an electrode structure, and a manufacturing method thereof.

Another object of the present disclosure is to provide an x-ray detection panel that is adapted to reduce a leakage current and to improve electrical characteristics.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to one general aspect of the present embodiment, an x-ray detection photo diode includes: a substrate; a first electrode formed on the substrate; a photoconductor layer formed on the first electrode in a narrower area than that of the first electrode; and a second electrode formed on the photoconductor layer.

An x-ray detection panel according to another general aspect of the present embodiment includes: a substrate; a gate line and a read-out line arranged to cross each other and to define a pixel region; a switch element disposed at the gate lines and read-out lines; and a photo diode disposed in the pixel region and configured to include a first electrode, a photoconductor layer, and a second electrode sequentially stacked. The first electrode is formed to expand outwardly along the circumference of the photoconductor layer and second electrode.

A method of manufacturing an x-ray detection photo diode according to still another aspect of the present embodiment includes: preparing a substrate; forming a first electrode on the substrate; forming a photoconductor layer on the first electrode in a narrower area than that of the first electrode; and forming a second electrode on the photoconductor layer.

A method of manufacturing an x-ray detection panel according to further still another aspect of the present embodiment includes: forming a switching element, which includes a gate line, a gate electrode, an active layer, and source/drain electrodes, on a substrate; and forming a photo diode electrically connected to the switching element. The formation of the photo diode including: forming a first electrode electrically connected to the drain electrode of the switching element; forming a photoconductor layer on the first electrode and in a narrower area than that of the first electrode; and forming a second electrode on the photoconductor layer and in a narrower area than that of the photoconductor layer.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this application, illustrate embodiment(s) of the invention and together with the description serve to explain the disclosure. In the drawings.

DETAILED DESCRIPTION

Figure 1:
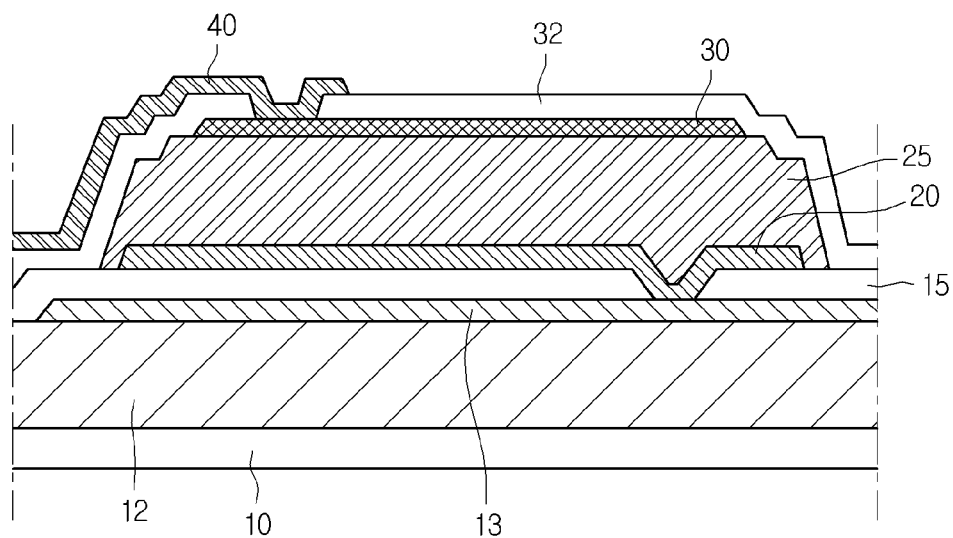
FIG. 1 is a cross-sectional view showing the structure of a pixel on an x-ray detection panel of the related art.

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, the size and thickness of the device might be expressed to be exaggerated for the sake of convenience in the drawings. Wherever possible, the same reference numbers will be used throughout this disclosure including the drawings to refer to the same or like parts.

Figure 2:
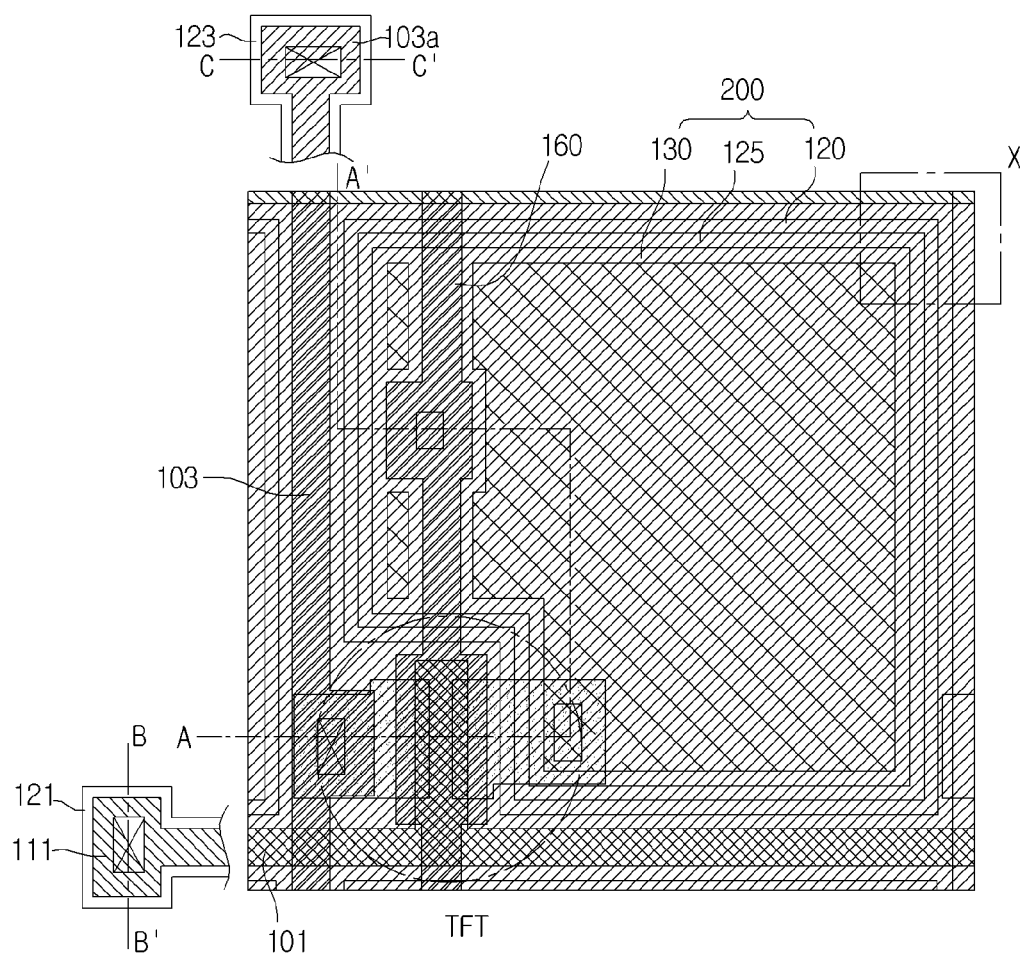
FIG. 2 is a planar view showing the structure of an x-ray detection pixel on an x-ray detection panel according to an embodiment of the present disclosure.

FIG. 2 is a planar view showing the structure of an x-ray detection pixel on an x-ray detection panel according to an embodiment of the present disclosure. Referring to FIG. 2, the x-ray detection pixel includes gate and read-out lines 101 and 103 arranged to cross each other and to define a pixel region, and a photo diode 200 disposed on the pixel region. The x-ray detection pixel further includes a switching element TFT positioned at the gate lines and read-out lines 101 and 103, and a power line 160 disposed to cross with the gate line 101 and to be parallel to the read-out line 103.

The photo diode 200 includes a cathode electrode 120, a photoconductor layer 125, and an anode electrode. The photo diode 200 according to the present disclosure allows the cathode electrode 120 to be formed in the largest size within the pixel region. The photoconductor layer 125 and the anode electrode 130 are stacked in sequentially smaller sizes on the cathode electrode 120.

The power line 160 parallel to the gate line 101 is disposed within the pixel region. Also, the power line 160 is disposed to overlap with the top portion of the switching element TFT.

A gate pad 111 is formed at one end portion of the gate line 101. Also, a gate contact pad 121 is formed on the gate pad 111. As such, a gate driving signal can be transferred from the exterior to the pixel region through the gate pad 111 and gate line 101 and used to turn-on the switching element TFT.

Moreover, a read-out line pad 103a is formed at one end portion of the read-out line 103. A read-out contact pad 123 is formed on the read-out pad 103a. In accordance therewith, an electric signal converted from the light by the photo diode 200 is charged into the photo diode 200 before it is applied to an external image display device.

Figure 3:
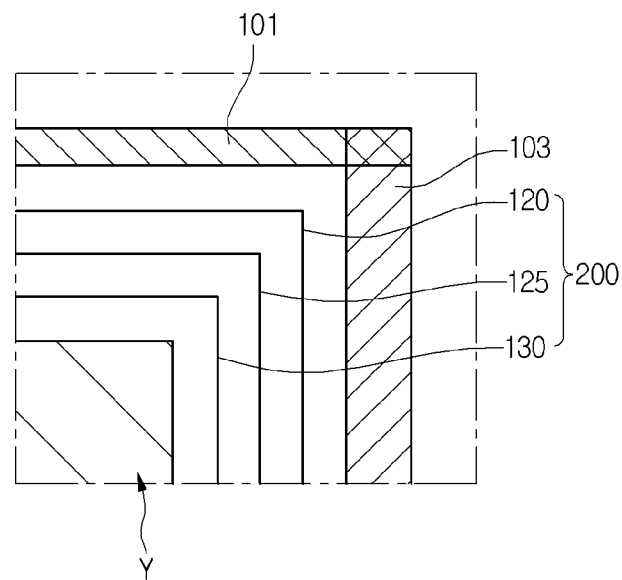
FIG. 3 is a planar view largely showing the domain of "X" in FIG. 2.

FIG. 3 is a planar view largely showing the domain of "X" in FIG. 2. As shown in FIG. 3, the x-ray detection photo diode 200 forces the cathodes electrode 120 to be formed in the widest area. Also, the x-ray detection photo diode 200 allows the photoconductor layer 125 and anode electrode 130 each having the sequentially smaller sized areas to be stacked on the cathode electrode 120. In other words, since the anode electrode 130 is structurally formed in the smallest area, edges of the photoconductor layer 125 are exposed outwardly from the anode electrode 130 and edges of the cathode electrode 120 are exposed outwardly from the photoconductor layer 125.

Consequently, the x-ray detection photo diode 200 according to the present disclosure is formed with the cathode electrode 120, photoconductor layer 125, and anode electrode 130 stacked in a pyramid shape. As such, the x-ray detection photo diode 200 according to the present disclosure has a gentler side surface than that of the related art. Therefore, the x-ray detection photo diode 200 can reduce a leakage current, as the cathode electrode 120 shields the photoconductor layer 125 to be not opposite the other electrodes under it.

A portion "Y" shown in the drawings corresponds to an open domain of the pixel region from which a most upper insulation film is removed. The open domain is used for receiving light.

Figure 4:
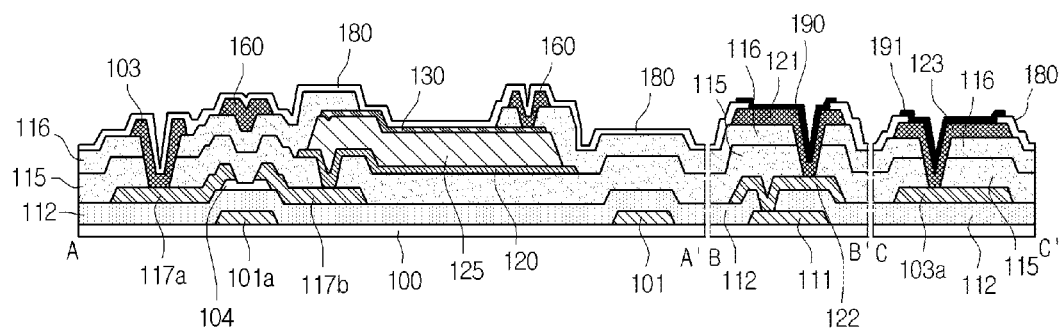
FIG. 4 is a cross-sectional view showing the x-ray detection pixel taken along lines A-A', B-B', and C-C' in FIG. 2.

FIG. 4 is a cross-sectional view showing the x-ray detection pixel taken along lines A-A', B-B', and C-C' in FIG. 2. Referring to FIG. 4, the x-ray detection pixel includes a gate line 101, a gate electrode 101a, and a gate pad 111. The gate line 101, gate electrode 101a, and gate pad 111 are formed by depositing a first metal film on a substrate 100 and then patterning the metal film according to a first mask process.

A gate insulation film 112, an amorphous silicon film, and an impurity-doped amorphous silicon film are sequentially formed on the entire surface of the substrate 100 loaded with the gate electrode 101a and so on. A second mask process is performed for the above silicon films, thereby forming an active layer 104 on the gate insulation 112 opposite to the gate electrode 101a.

After the active layer 104 is formed, a second metal film is formed on the substrate 100 provided with the active layer 104. A third mask process is performed for the second metal film, so as to form source/drain electrodes 117a and 117b, a gate pad connector 122, and a read-out pad 103a.

Then, a first interlayer insulation film 115 is formed on the substrate 100 loaded with the source/drain electrodes 117a and 117b and so on. A fourth mask process is performed for the first interlayer insulation film 115, in order to expose the drain electrode 117b. Also, a third metal film is formed on the substrate 100 covered with the first interlayer insulation film 115, and then a fourth mask process is performed for the third metal film, so that a cathode electrode 120 is formed on the pixel region. The cathode electrode 120 is connected to the drain electrode 117b through the contact hole.

Thereafter, a photoconductor electrode 125 and an anode electrode 130 are sequentially formed on the cathode electrode 120. The anode electrode 130 can be formed from one material selected from a transparent material group which includes ITO (indium-tin oxide), IZO (indium-zinc oxide), and ITZO (indium-tin-zinc oxide). The photoconductor layer 125 is formed in a smaller size that that of the cathode electrode 120. As such, edges of the cathode electrode 120 are exposed along the outer circumference of the photoconductor layer 125. The cathode electrode 120 can be formed from a metal material such as molybdenum Mo.

After the photo diode 200 is formed within the pixel region, a second interlayer insulation film 116 is formed on the entire surface of the substrate 100 provided with the photo diode 200. Then, a fifth mask process is performed for the second interlayer insulation film 116, in order to expose a source electrode domain, a gate pad domain, a data pad domain, and the anode electrode 130 of the photo diode 200.

Thereafter, a fourth metal film is formed on the substrate 100 covered with the second interlayer insulation film 116. A read-out line 103, a power line 160, a gate contact pad 121, and a read-out contact pad 123 are formed by performing a sixth mask process for the fourth metal film. Subsequently, a protective film 180 is formed on the entire surface of the substrate 100 loaded with the read-out line 103 and so on, and then a seventh mask process is performed for the protective film 180 so as to open the gate contact pad 121 and the read-out contact pad 123. Moreover, first and second contact portions 190 and 191 are formed on the opened gate contact pad 121 and the opened read-out contact pad 123, respectively. The first and second contact portions 190 and 191 can be formed from one transparent conductive material selected from a group of ITO and IZO.

Figure 5:
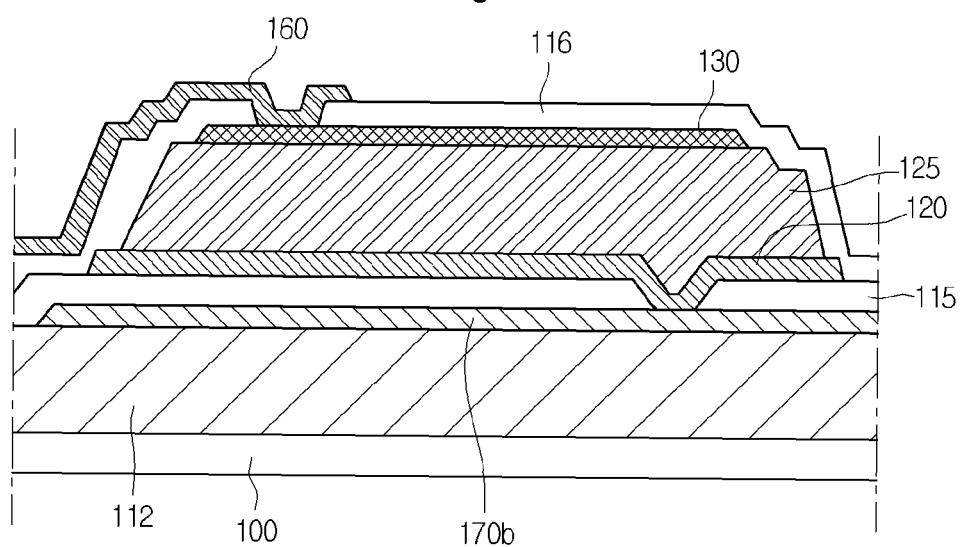
FIG. 5 is a cross-sectional view showing an x-ray detection photo diode according to an embodiment of the present disclosure.

FIG. 5 is a cross-sectional view showing an x-ray detection photo diode according to the present disclosure. Referring to FIG. 5, the x-ray detection diode 200 includes a gate insulation film 112 formed on a substrate 100, a drain electrode 117b formed on the gate insulation film 112, and a first interlayer insulation film 115 formed to cover the drain electrode 117b. The first interlayer insulation film 115 is formed to have a contact hole.

The x-ray detection photo diode 200 further includes a cathode electrode 120 formed on the first interlayer insulation film 115. The cathode electrode 120 is formed to electrically contact the drain electrode 117b through the contact hole.

Also, the x-ray detection photo diode 200 includes a photoconductor layer 125 and an anode electrode 130 sequentially formed on the cathode electrode 120. The photoconductor layer 125 and the anode electrode 130 are formed in narrower sizes than that of the cathode electrode 120. In detail, the x-ray detection diode 200 forces the cathode electrode 120, photoconductor layer 125, and anode electrode 130 to be sequentially narrowed in areas. As such, the edges of the cathode electrode 120 are exposed along the outer circumference of the x-ray detection photo diode.

Moreover, the x-ray photo diode 200 includes a second interlayer insulation film 116 formed to cover the anode 130, and a power line 160 formed on the second interlayer insulation film 116. The power line 160 is electrically connected to the anode electrode 130 through a contact hole which is formed in the second interlayer insulation film 116.

In this manner, the x-ray detection photo diode 200 is formed to be gradually narrowed in area as it goes from the cathode electrode 120 to the anode electrode 130 through the photoconductor layer 125. As such, the side surface of the x-ray detection photo diode 200 can be gently inclined. Therefore, the x-ray detection photo diode can reduce the leakage current quantity, as the cathode electrode 120 forces the photoconductor layer 125 to be not opposite the other electrodes under the cathode electrode 120. This is apparently revealed through experimental data of FIG. 6.

Figure 6:
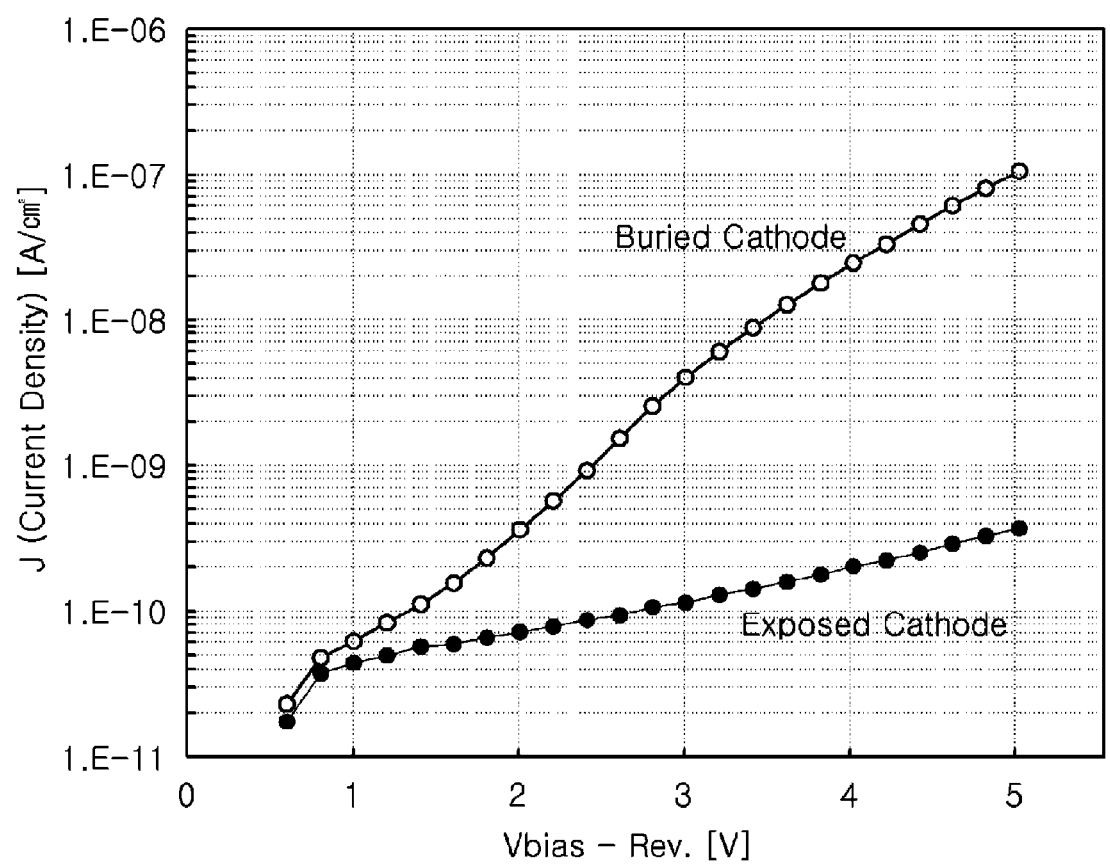
FIG. 6 is a graphic diagram showing quantitative leakage current characteristics of the photo diodes according to the present disclosure and the related art.

FIG. 6 is a graphic diagram showing current leakage quantities measured in the photo diodes according to the present disclosure and the related art.

The related art photo diode forces a lower electrode (i.e., the cathode electrode 20) to be formed in a narrower size than that of the photoconductor layer 25. In other words, the cathode electrode 20 is buried in the photoconductor layer 25, as shown in FIG. 1. Due to this, the current leakage quantity in the related art photo diode rapidly increases with increasing of a voltage on the power line 40, as shown in FIG. 6.

However, the x-ray detection photo diode 200 according to the present disclosure forces not only a lower electrode (i.e., the cathode electrode 120) to be formed in the widest size, but also the photoconductor layer 125 and an upper electrode (i.e., the anode electrode 130) to be formed in sequentially smaller sized areas. In other words, the photo diode 200 according to the present disclosure includes an exposed cathode electrode, as shown in FIGS. 4 and 5. As such, the leakage current quantity in the photo diode 200 according to the present disclosure slightly increases as the voltage on the power line 160 increases, as shown in FIG. 6.

As described above, the x-ray detection photo diode of the present disclosure with such an electrode structure can greatly reduce the current leakage quantity compared to that of the related art. Furthermore, the current leakage quantity in each of the pixels which are formed to include the x-ray detection photo diode 200 on the substrate can be greatly reduced in comparison with that of the related art pixel. Therefore, electrical characteristics of the x-ray detection pixel and the panel with the same can be improved.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An x-ray detection panel comprising:
a substrate;
a gate line and a read-out line arranged to cross each other and to define a pixel region;
a switch element disposed at the gate lines and read-out lines; and
a photo diode disposed in the pixel region and configured to include a first electrode, a photoconductor layer, and a second electrode sequentially stacked,
wherein the first electrode is formed to expand outwardly along the circumference of the photoconductor layer and second electrode,
wherein a lateral surface of photoconductor layer is inclined,
further comprising a power line disposed parallel to the read-out line and used to transfer a bias voltage to the photo diode,
wherein the power line is disposed to overlap with a gate electrode of the switching element,
wherein the first electrode is formed to electrically contact a drain electrode through a contact hole, and
wherein the contact hole is disposed to overlap with the photoconductor layer.

2. The x-ray detection panel claimed as claim 1, wherein the photo diode is formed in a small-sized area as it goes from the first electrode to the photoconductor layer and the second electrode.

3. The x-ray detection panel claimed as claim 1, wherein the first and second electrodes are used as cathode and anode electrodes, respectively.

4. The x-ray detection panel claimed as claim 1, wherein the second electrode is formed from a transparent conductive material.

5. A method of manufacturing an x-ray detection panel comprising:
forming a switching element, which includes a gate line, a gate electrode, an active layer, and source/drain electrodes, on a substrate;
forming a photo diode electrically connected to the switching element, the forming of the photo diode including:
forming a first electrode electrically connected to the drain electrode of the switching element;
forming a photoconductor layer on the first electrode and in a narrower area than that of the first electrode; and
forming a second electrode on the photoconductor layer and in a narrower area than that of the photoconductor layer,
wherein a lateral surface of photoconductor layer is inclined,
further comprising forming a power line, which is electrically connected to the second electrode of the photo diode, on the substrate loaded with the photo diode,
wherein the power line is disposed to overlap with a gate electrode of the switching element,
wherein the first electrode is formed to electrically contact a drain electrode through a contact hole, and
wherein the contact hole is disposed to overlap with the photoconductor layer.

6. The method claimed as claim 5, wherein the first electrode of the photo diode is formed to be exposed outwardly from edges of the photoconductor layer and second electrode.

7. An x-ray detection photo diode comprising:
a substrate;
a first electrode formed on the substrate;
a photoconductor layer formed on the first electrode in a narrower area than that of the first electrode; and
a second electrode formed on the photoconductor layer,
wherein a lateral surface of photoconductor layer is inclined,
further comprising a power line disposed parallel to the read-out line and used to transfer a bias voltage,
wherein the power line is disposed to overlap with a gate electrode of the switching element,
wherein the first electrode is formed to electrically contact a drain electrode through a contact hole, and
wherein the contact hole is disposed to overlap with the photoconductor layer.

8. The x-ray detection photo diode claimed as claim 7, wherein the second electrode is formed in a narrower area than that of the photoconductor layer.

9. The x-ray detection photo diode claimed as claim 7, wherein the first and second electrodes are used as cathode and anode electrodes, respectively.

10. The x-ray detection photo diode claimed as claim 7, wherein the second electrode is formed from a transparent conductive material.

11. A method of manufacturing an x-ray detection photo diode comprising:
preparing a substrate;
forming a first electrode on the substrate;
forming a photoconductor layer on the first electrode in a narrower area than that of the first electrode; and
forming a second electrode on the photoconductor layer,
wherein a lateral surface of photoconductor layer is inclined,
further comprising forming a power line connected to the second electrode,
wherein the power line is disposed to overlap with a gate electrode of the switching element,
wherein the first electrode is formed to electrically contact a drain electrode through a contact hole, and
wherein the contact hole is disposed to overlap with the photoconductor layer.

12. The method claimed as claim 11, wherein the first electrode is formed to be exposed outwardly from edges of the photoconductor layer and second electrode.

* * * * *